350-96.13 SR
XR 3,916,351

United S
Jacobs et al.

[11] 3,916,351
[45] Oct. 28, 1975

[54] ELECTRONIC FREQUENCY SELECTOR

[75] Inventors: Harold Jacobs, West Long Branch; Metro M. Chrepta, Neptune, both of N.J.

[73] Assignee: The United States of America as represented by the Secretary of the Army, Washington, D.C.

[22] Filed: Aug. 6, 1974

[21] Appl. No.: 495,156

[52] U.S. Cl........... 333/73 R; 333/73 W; 333/83 R; 350/96 WG; 357/29; 357/55; 357/58
[51] Int. Cl.$^2$.. H01P 7/06; H01P 1/20; H01L 29/06
[58] Field of Search... 333/73 R, 73 W, 83 R, 98 R; 350/96 WG, 160; 357/18, 55, 58; 307/29, 88.3

[56] References Cited
UNITED STATES PATENTS
3,417,246 12/1968 Hall .................................. 357/18 X

*Primary Examiner*—James W. Lawrence
*Assistant Examiner*—Marvin Nussbaum
*Attorney, Agent, or Firm*—Nathan Edelberg; Robert P. Gibson; Daniel D. Sharp

[57] ABSTRACT

An adjustable electronic frequency selector which comprises a block of high-resistivity bulk single crystal intrinsic semiconductor forming a low-loss cavity resonator for millimeter and submillimeter waves, and control means which includes either a semiconductor appendage mounted to one major surface of said semiconductor resonator block in which is formed doped regions of opposite conductivity type or which includes doped regions of opposite conductivity type formed within a portion of said resonator block adjacent either one major surface or formed within two juxtaposed major surfaces of said portion of the resonator block. A variable unidirectional forward biasing voltage source is connected across said doped regions of opposite conductivity type. The lowest frequency of resonance, as well as the frequency separation between possible operating frequencies of said resonator, depends, in part, upon the length of the semiconductor cavity resonator block. The frequency separation also is a function of the effective dielectric constant of the resonator block. The frequency separation can be electronically adjusted by varying the aforesaid forward biasing voltage to control the concentration of carriers injected into one major surface of the resonator block or the appendage thereto, as the case may be.

16 Claims, 11 Drawing Figures

3916351
OR IN 333/73R

ELECTRONIC FREQUENCY SELECTOR

BACKGROUND OF THE INVENTION

As explained in our copending U.S. patent application, Ser. No. 397,184, now U.S. Pat. No. 3,866,143, it is extremely difficult and costly to construct conventional metal walled waveguides or resonators for use in the millimeter and submillimeter band, that is, at frequencies from about 10GHz to 500GHz, since the dimensions, which are of the order of at least one-half wavelength in the material, must be very small. Moreover, the tolerances for such small sizes are so poor that operation at modes other than the desired mode readily ensures, causing excessive energy losses.

Examples of phase shifter devices are shown in FIGS. 3 and 5 of the aforesaid copending application. In FIG. 3, juxtaposed doped regions of opposite conductivity type are formed within opposite major surfaces of a portion of a semiconductor waveguide medium adjacent said surfaces and a variable unidirectional voltage source is connected to the doped regions. In FIG. 5, at least two spaced doped regions of opposite conductivity type are formed within a portion of the semiconductor waveguide along one surface thereof and the doped regions are connected to a variable unidirectional biasing voltage supply. As the biasing voltage is increased, an increase in the number of carriers injected into the intrinsic region of the semiconductor waveguide disposed between the doped regions of opposite conductivity type occurs and the conductivity of the semiconductor waveguide is correspondingly increased. The effective guide wavelength in said portion of the semiconductor waveguide decreases, so that the phase shift of energy propagating in the waveguide decreases.

Further examples of phase shifter devices are shown in FIGS. 6 to 9 of the aforesaid copending application wherein a relatively thin intrinsic single crystal semiconductor appendage is mounted on one of the major surfaces of a semiconductor waveguide; this appendage includes biased diode control means comprising p and n type doped regions formed within the appendage. The regions of opposite conductivity type are in contact with electrodes grounded to positive and negative terminals of a unidirectional forward biasing power supply. As the forward bias voltage is increased, more carriers are injected into the intrinsic region of the appendage along points close to said major surface and generally transverse to the direction of wave energy propagation. As the conductivity of the intrinsic region adjacent the semiconductor waveguide increases, owing to an increase in the number of such injected carriers, the effective height of the semiconductor waveguide over the portion thereof juxtaposed to the appendage is increased, resulting in a decrease in effective guide wavelength in said junction and an increase in phase shift of energy propagating along the waveguide.

In contrast with the phase shifters of the aforesaid copending application, the present invention relates to a frequency selector including a semiconductor block of such physical dimension as to resonate at discrete frequencies.

The length $L$ of the resonator block required for resonance can be given by $$L = m/2\ \lambda_g \text{ where } m = 1, 2, 3 \qquad (1)$$

The guide wavelength $\lambda_g = \lambda_z$ is given by $$\lambda_g = \frac{\lambda_o}{\sqrt{\epsilon_{r_{eff}}}} \qquad (2)$$

where $\epsilon_{r_{eff}}$ represents the effective dielectric constant of the waveguiding medium under conditions of forward bias and $\lambda_o$ is the wavelength of energy in free space and does not depend on the properties of the waveguiding medium. Equation (2) can be rewritten as $$\sqrt{\epsilon_{r_{eff}}} = \frac{\lambda_o}{\lambda_g} \qquad (3)$$

The guide wavelength is given approximately by the following equation $$\lambda_g = 2\pi \left[ k_1{}^2 - \left(\frac{\pi}{a}\right)^2 \left(1 + \frac{2A}{\pi}\right)^{-2} - \left(\frac{\pi}{b}\right)^2 \left(1 + \frac{2A}{\pi n_1{}^2 b}\right)^{-2} \right]^{-1/2} \qquad (4)$$

Where $A$ is approximately equal to one-half wavelength in the infinite semiconductor material of which the resonator block is constituted, that is, $$A \approx \frac{\lambda_o}{2} \frac{1}{(n^2-1)^{1/2}} \approx \frac{\lambda_o}{2\sqrt{\epsilon_r}} \qquad (5)$$

where $n^2{}_1$ represents the square of the index of refraction and equals $\epsilon_r$ (approximately 12 for silicon), $k_1 = 2\pi/\lambda$ and $a$ and $b$ are the broad and narrow dimensions of the resonator block. If the forward bias is increased from zero to some value in the forward direction, a change in injected carrier concentration occurs and this infusion of carriers acts much as an electrically conductive member lying close to the major surface of the resonator block along which the control means is disposed. Consequently, one obtains an image effect in which the narrow or $b$ dimension of the resonator block is effectively doubled in the case of maximum carrier concentration. For values of bias lying between zero and maximum, of course, the image effect is reduced proportionately in a somewhat nonlinear manner. In other words, as the bias is adjusted between zero and a maximum value, corresponding to maximum carrier injection, the small ($b$) dimension of the resonator block varies from a value $b$ to a value of approximately $2b$. From equation (4) it is evident that by varying $b$ (with $k_1$, $a$, $A$ and $n_1$ being constant) $\lambda_g$ will vary in consequence. As the forward bias is increased, the dimension $b$ increases relative to dimension $a$ and one observes that $\lambda_g = \lambda_z$ which is of the form $$\lambda_g = \frac{1}{\sqrt{k_I - k_{II}/a^2 - k_{III}/b^2}} \qquad (6)$$

decreases, since the $k_{III}/b_2$ term increases and makes the denominator larger. In consequence, the effective dielectric constant $\epsilon_{r_{eff}}$ of the waveguiding medium (semiconductor resonator block) increases with increasing forward bias.

The frequency separation $\Delta f$ of the harmonically related resonant frequencies is given by $$\Delta f = \frac{c}{2L} = \frac{c_o/\sqrt{\epsilon_{r_{eff}}}}{2L} = \frac{c_o}{2L\sqrt{\epsilon_{r_{eff}}}} \quad (7)$$

where $c_o$ is the velocity of electromagnetic energy propagation in free space. The lowest frequency of resonance $f$ also is given by equation (7).

As indicated by equation (7), the increase in effective dielectric constant owing to the increase in carrier concentration within the resonator block, or appendage thereto, as the case may be, for a given length $L$ of resonator block, will result in a decrease in the lowest frequency of resonance. The various frequencies of resonance, that is the number $m$ of wavelengths in the resonator material can be given as $$f_m = \frac{m}{2} \frac{c_o}{L\sqrt{\epsilon_{r_{eff}}}} \quad (8)$$

where $m = 1, 2, 3, \ldots$

The semiconductor resonator block is first cut to a length $L$ given by equation (8). If one desires a filter resonating at a frequency $f_{m=1}$ of 10GHz, the length would be $$L = (0.5) \frac{8\times10^{10}}{\sqrt{12}\times10^{10}} = \frac{1.5\times10^{10}}{3.46\times10^{10}} = 0.435 \text{ cm.}$$

Since the length, for $m = 1$, corresponds to one-half wavelength, the wavelength $\lambda_g = \lambda_z$ in the semiconductor resonator block would be twice this length, or substantially 0.87 centimeter. This resonator filter, in addition to resonating at 10GHz (when $m = 1$ and $\lambda_g = 1/2L$), would resonate also at 20GHz (when $m = 2$ and $\lambda_g = L$), at 30GHz (when $m = 3$ and $\lambda_g = 3/2\ L$), 40 GHz ($m = 4$ and $\lambda_g = 2L$), and so forth; and the frequency separation obviously is 10GHz. The semiconductor filter thus can be made to pass signal frequencies for which the filter resonator length is substantially equal to, or an integral multiple of, said signal half wavelength.

One could, for example, double the length of the resonator block just described so that the length $L = 0.87$ centimeter. Application of equation (8) would yield $$m = 1\ f = 0.5 \frac{3\times10^{10}}{3.46\times0.87} = \frac{3\times10^{10}}{6} = 5\times10^{9} = 5GHZ$$

$$m = 2\ f = \frac{2}{2} \frac{3\times10^{10}}{3.0\times10} = 10GHZ$$

$$m = 3\ f = \frac{3}{2} \frac{3\times10^{10}}{3.0} = 15GHZ$$

and so forth. The resonator block would include a resonance at 10GHz, as in the previous example. Now, however, the lowest resonant frequency is 5GHz and the frequency separation is decreased to 5GHz. In other words, one decreases the frequency separation as one increases the length of the resonator block. Because of the relatively wide (octave) separation in resonances, however, it is easily possible to operate with a band of incoming frequencies such that only one of the resonant peaks is encountered. It is possible, of course, to use multiple filter resonator blocks so as to either narrow or shape the filtering, as contrasted with a single filter resonator block.

If, in either of the two examples just described, viz, when the incoming frequency at which resonance is desired is 10GHz and the length is either 0.435cm or 0.87cm, the effective dielectric constants $\epsilon_{r_{eff}}$ is varied. It is possible to control the resonant frequency of the resonator block over a considerable range. For example, we have changed frequency (or bandwidth) by as much as 25% at a center frequency of 16 GHz. This control can be accomplished, with spaced doped regions of opposite conductivity type formed within the intrinsic semiconductor resonator block itself, adjacent one major surface thereof. The foreward biasing source then is connected by way of electrodes across the diode formed by the doped regions and the portion or portions of the intrinsic semiconductor resonator block disposed therebetween.

Alternatively, the control can be accomplished with a semiconductor control appendage mounted to one of the major surfaces of the resonator block, with spaced doped regions of opposite conductivity type formed within the appendage. The unidirectional forward bias voltage source then is connected by way of electrodes across the diode formed by the doped regions of the appendage and the portion of the intrinsic semiconductor appendage disposed therebetween.

Summarizing, an increase in forward control bias voltage causes the effective dielectric constant $\epsilon_{r_{eff}}$ of the semiconductor resonator block to increase. The numerator of the equation (8) would then decrease, indicating a decrease in lowest frequency of resonance and a decrease in frequency separation $\Delta f$. A decreasing forward bias voltage, on the other hand, would act to increase the lowest resonant frequency and the frequency separation, just as would a decrease in actual length $L$ of the resonator block.

and

Figure 7:
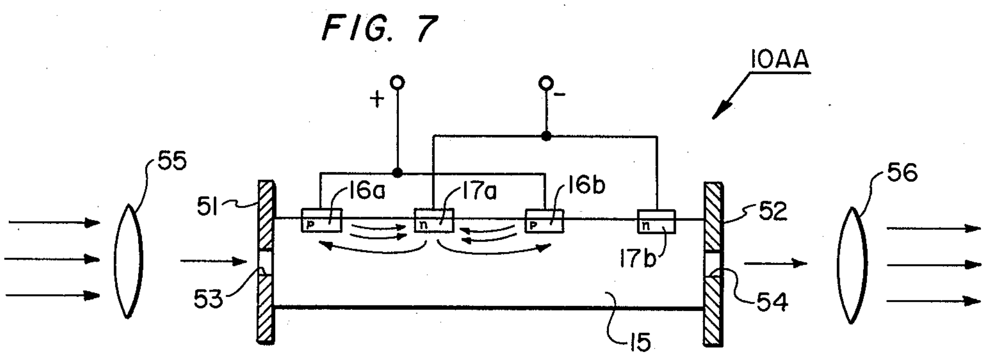

FIG. 7 illustrates a tunable resonant filter which includes energy reflecting layers at each end thereof.

Figure 1:
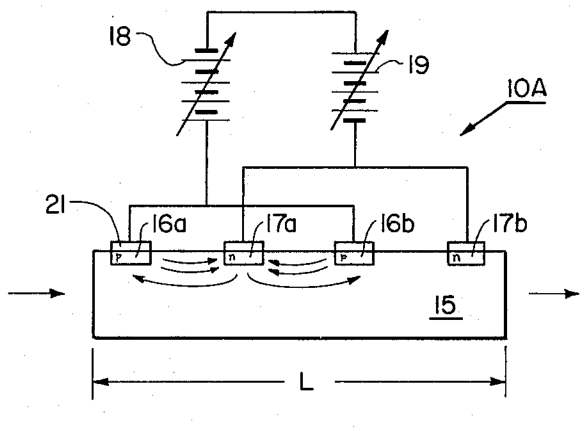
FIG. 1 is a view of a tunable resonant filter having a plurality of forward-biased p and n doped regions formed near one major surface of a semiconductor resonant filter medium of predetermined length.

Referring to the drawing, a resonant filter device 10A is shown in FIG. 1 and includes an intrinsic semiconductor block 15 near one major surface of which a plurality of p-type doped regions 16*a*, 16*b*, etc., and a like plurality of n-type doped regions 17*a*, 17*b*, etc., is formed. The alternate regions 16 and 17 of opposite conductivity type are maintained at opposite polarity by being connected to oppositely polarized power supplies 18 and 19, as shown in FIG. 1. The necessary electrical connections are made to electrodes 21 which may be thin metallic layers formed on the surfaces of the doped regions by any of the usual integrated circuit technques. A given p-type doped region, such as a region 16, the adjacent n-type doped region 17, and the portion of the intrinsic semiconductor resonant filter block 15 lying therebetween combine to form a forward-biased PIN diode. Carriers thus are injected into the semiconductor resonator block 15, with the hole and electron migration being shown by the arrows. If the carrier lifetime is sufficiently short and if the doped regions are sufficiently closely spaced, a substantial portion of the carriers will remain along paths near the surface, as shown by the arrows in FIG. 1 and the number of carriers traveling into the semiconductor perpendicular to the major surfaces will be relatively few. Thus, a region of changing conductivity is produced at or near the surface of the resonant filter block 15 between the various doped regions, whereby only incident millimeter or submillimeter wave energy of certain frequency content will emerge therefrom.

Modifications of the resonant filter device of FIG. 1 are shown in FIGS. 2 to 5, wherein a thin intrinsic single crystal semiconductor member or appendage 20 is mounted on one of the major surfaces of the semiconductor filter block 15; the appendage 20 can be provided with slant end faces in order to improve matching between the resonator block 15 and the appendage 20.

Figure 2A:
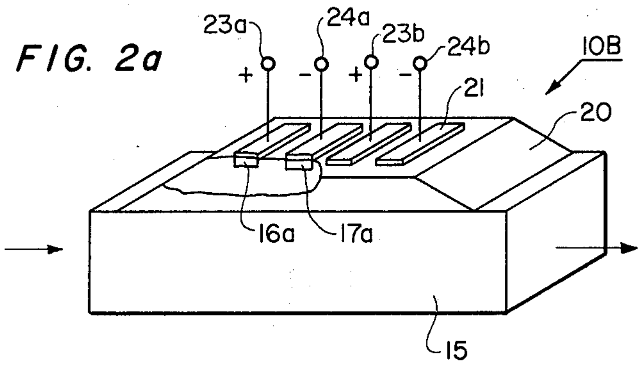
FIGS. 2a and 2b are views illustrating an embodiment of tunable resonant filter having an intrinsic semiconductor appendage of rectangular cross section mounted on the semiconductor resonant filter medium and having formed therein doped regions which partially comprise one or more control diodes.
Figure 2B:
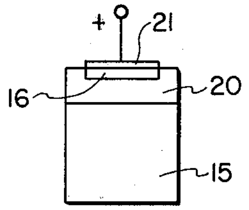

In the resonant filter device 10B of FIGS. 2*a* and 2*b*, a plurality of spaced transverse alternating p-type regions 16 and n-type regions 17*a* are formed within the appendage 20. Although the transverse regions 16 and 17 are shown to be shorter than the transverse dimension of appendage 20, they can extend the entire width of the appendage. Since the electric field is a maximum at or near the center of the filter block appendage 20, the largest control occurs at the center of the lateral dimension of the waveguide appendage. As in the device of FIG. 1, the p and n-type regions 16 and 17 are in contact with electrodes 21 which are connected to positive and negative terminals 23 and 24, respectively, of a unidirectional power supply; in other words, the PIN diodes formed by adjacent p and n regions and that portion of the intrinsic semiconductor of the appendage lying therebetween are forward biased. The carriers are injected along paths within the appendage similar to those shown in FIG. 1. Because of the crystal interface or boundary between the appendage 20 and the resonant filter block 15, none of the carriers can pass down into the depths of the filter block 15 and cause undesirable attenuation to occur. As in the resonant filter 10B of FIG. 2, if the forward bias voltage is increased, the effective height of the semiconductor resonator block 15 over the portion thereof juxtaposed to the appendage 20 is increased. This results in a decrease in effective guide wavelength in that portion of the resonator block 15 and a decrease of both frequency separation and of the lowest frequency of resonance of the resonant filter 10.

Figure 3A:
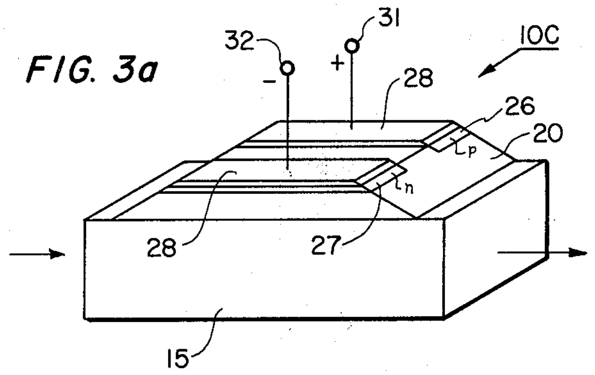
FIGS. 3a and 3b are views illustrating a tunable resonant filter wherein the doped regions of the semiconductor appendage of rectangular cross section are elongated regions extending along the direction of propagation of energy.
Figure 3B:
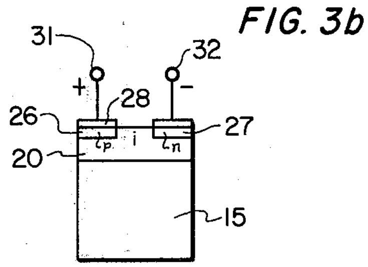

Another type of resonant filter 10C is shown in FIGS. 3*a* and 3*b* in which the appendage 20 attached to the filter block 15 includes a pair of longitudinal p- and n-type regions 26 and 27 formed in the upper surface of the appendage 20 along opposite sides thereof; these doped regions 26 and 27 are spaced apart by an intrinsic region which merges into a wider region (see FIG. 3*b*) which can extend across the appendage. When the PIN diode formed by the p- and n-strips or regions 26 and 27 and the inverted T-shaped intrinsic region is forward biased by connecting the electrodes 28 contacting regions 26 and 27 to the positive and negative terminals 31 and 32, respectively, of a forward biasing source, carriers are injected into the intrinsic region along paths generally transverse to the direction of propagation of wave energy, thereby changing the conductivity of the latter region.

Figure 4A:
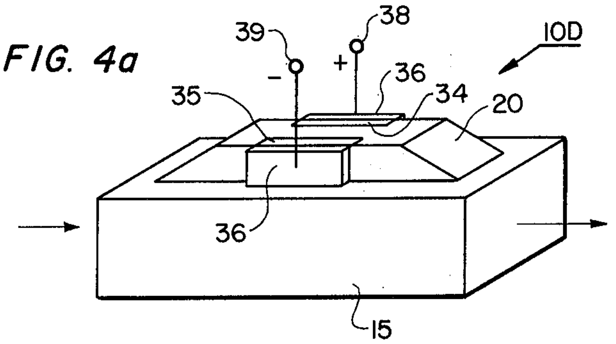
FIGS. 4a and 4b are views illustrating a tunable resonant filter wherein the doped regions of the semiconductor appendage of rectangular cross section are arranged along the sides of the appendage.
Figure 4B:
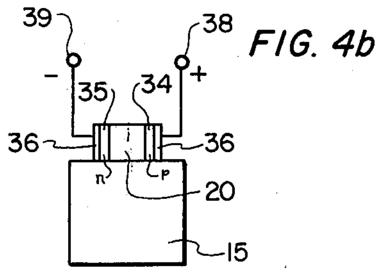

Still another version 10D of a resonant filter is shown in FIGS. 4*a* and 4*b*, in which the p- and n-doped regions 34 and 35 are formed along the sides of the appendage 20. These doped regions are connected by the electrodes 36 to positive and negative terminals 38 and 39, respectively. The general direction of movement of the injected carriers into the intrinsic region is transverse to the direction of propagation of wave energy, as in the device of FIGS. 3*a* and 3*b*. The doped regions need not extend to the surface of the resonator block; however, as the doped regions of the appendage become closer to the resonator block 15, the change in effective dielectric constant of the latter is somewhat enhanced, other parameters remaining constant.

Figure 5A:
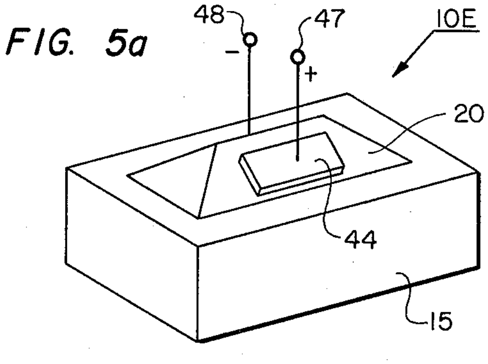
FIGS. 5a and 5b are views illustrating a tunable resonant filter wherein the semiconductor appendage is of triangular cross section.
Figure 5B:
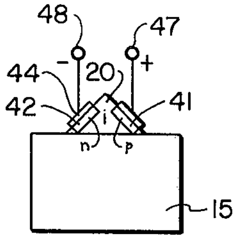

In the resonant filter device 10E of FIGS. 5*a* and 5*b*, the semiconductor diode appendage 20 is of triangular cross section with the p- and n-doped regions 41 and 42 formed in the slanting sides of the appendage. As in the devices previously described, a forward bias is applied to the PIN diode formed within the appendage 20 by connecting the electrodes 44 contacting p and n doped regions 41 and 42 to the positive and negative terminals 47 and 48, respectively, of the unidirectional bias voltage source. When the forward bias voltage is small, the carriers are concentrated in the limited region near the apex of the triangular region. As the dc bias potential is increased, the proportion of the triangular intrinsic semiconductor occupied by free carriers increases, until finally, the whole volume of the appendage lying between the doped regions 41 and 42 becomes substantially filled with free carriers. As the bias control voltage increases, the effective height b of the resonator block increases and a decrease in the guide wavelength $\lambda_g = \lambda_z$ results. As the effective guide wavelength decreases as a function of the magnitude of the forward direct current bias potential applied to the PIN diode, the effective dielectric constant increases and the various frequencies of resonance of the semiconductor resonator block decreases.

Figure 6:
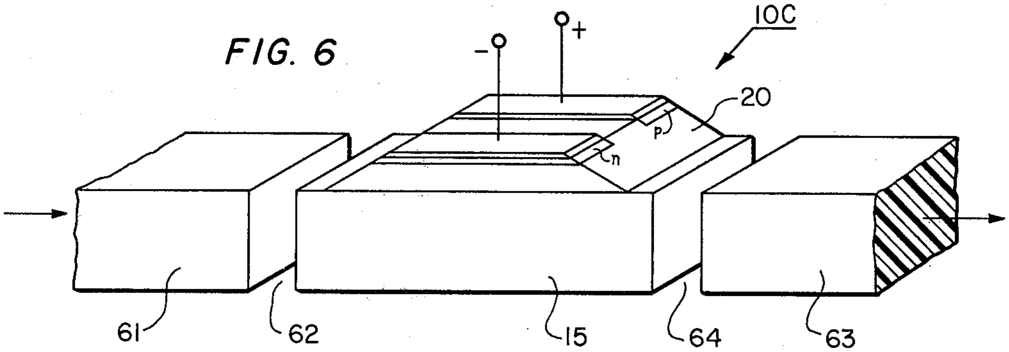
FIG. 6 is a view showing a tunable resonant filter wherein coupling to input and output semiconductor waveguiding media is accomplished by air gaps which can be dimensioned so as to cause energy reflection.

The manner in which energy can be introduced in the resonator block 15 and coupled therefrom, is shown in FIG. 6, wherein the resonant filter device 10C shown in FIG. 3*a* is illustrated by way of example. Energy propagating along a semi-conductor waveguiding medium 61 can be coupled into the semiconductor resonator block 15 by means of an air gap 62 which is preferrably between zero (actual contact) and about one-quarter wavelength or odd-quarter wavelengths in air. At one-quarter wavelength in air one gets the maximum reflections from the ends. The energy emerging from the resonant filter device 10 is coupled into a semiconductor waveguiding medium 63 through a second air gap 64 which is dimensionally similar to that of air gap 62. This discontinuity acts as a reflector and can enhance the Q of the resonant filter device. The air gap coupling approach shown in FIG. 6 obviously can be used whether or not the resonant filter device includes an appendage, and regardless of the type of appendage, if any.

In some instances, the Q of the resonator block also can be improved by providing thin metallic layers at the ends of the resonator block 25, which layers, for example, can be deposited on the ends by vacuum deposition techniques. Such layers must, of course, be partially transparent to quasi-optical (millimeter or submillimeter) wave energy. Instead of using solid electrically conducting layers at the ends of the resonator block, the resonator filter device 10 of FIG. 1, for example, could be modified as shown in FIG. 7, to include electrically conducting plates 51 and 52 at the ends of the semiconductor resonator block 15. Incoming energy can be focused, as by a converging lens 55, into a relatively narrow central aperture 53 in plate 51, while energy can be made to emerge from resonator block 15 by way of an aperture 54 in plate 52. A diverging lens 56 can be used in reestablish the original beam cross-section. Although direct application of a control bias to the resonator block 15 is illustrated in FIG. 7, it should be understood that the technique illustrated in FIG. 7 also is applicable whether or not an appendage is used for control purposes.

It should be understood that the variable unidirectional control voltage in the devices shown in FIGS. 1–7 can include a fixed bias level about which the voltage can be varied in either direction.

Although the invention has been shown and described with reference to a particular embodiment, it will be apparent to those skilled in the art that various modifications and changes can be made to the embodiment shown and described without departing from the spirit and scope of the invention, as set forth in the claims.

What is claimed is:

1. A resonant filter for selectively passing only those components of quasi-optical wave energy of frequency $f$ and the harmonics thereof comprising a bulk single crystal intrinsic semiconductor resonator medium receptive of said wave energy and from which said wave energy components emanate, said medium having a length $L$ given by the relation $$L = \frac{mc_o}{2\sqrt{\epsilon_{r_{eff}}}}$$

where $m$ is any integer excluding zero, $c_o$ is the velocity of propagation of said wave energy in free space, and $\epsilon_r$ is the effective dielectric constant of said semiconductor medium and $f$ corresponds to the lowest resonant frequency of the said filter, and electrical control means disposed along a portion of said medium to which a variable unidirectional control voltage is applied for adjusting the conductivity of said control means to effect a change in the effective dielectric constant of said medium and thereby the lowest resonant frequency $f$ and the frequency separation $\Delta f$ of adjacent harmonics of frequency $f$.

2. The combination of claim 1 wherein said electrical control means includes spaced doped regions of opposite conductivity type formed within and adjacent one major surface of said portion of said medium and wherein said doped regions are connected across said control voltage.

3. The combination of claim 2 wherein said doped regions and the portion of said medium lying therebetween constitute a PIN diode.

4. The combination of claim 1 including an appendage mounted on a portion of said medium and consisting of a bulk single crystal intrinisic semiconductor, said electric control means being disposed along said appendage.

5. The combination of claim 4 wherein said electrical control means includes spaced doped regions of opposite conductivity type formed within and adjacent one major surface of said portion of said medium and wherein said doped regions are connected across said control voltage.

6. The combination of claim 1 further including metallic layers positioned at the ends of said semiconductor resonator medium.

7. The combination of claim 6 wherein said metallic layers are partially transparent to said quasi-optical wave energy.

8. The combination of claim 6 wherein said metallic layers each contain central apertures through which focused quasi-optical energy can be directed.

9. The combination of claim 1 further including input and output semiconductor waveguiding media spaced from said semiconductor resonator medium substantially an odd number of quarter wavelengths in air.

10. The combination of claim 2 further including metallic layers positioned at the ends of said semiconductor resonator medium.

11. The combination of claim 5 further including metallic layers positioned at the ends of said semiconductor resonator medium.

12. The combination of claim 2 further including input and output semiconductor waveguiding media spaced from said semiconductor resonator medium substantially an odd number of quarter wavelengths in air.

13. The combination of claim 5 further including input and output semiconductor waveguiding media spaced from said semiconductor resonator medium substantially an odd number of quarter wavelengths in air.

14. The combination of claim 6 further including input and output semiconductor waveguiding media spaced from said semiconductor resonator medium substantially an odd number of quarter wavelengths in air.

15. The combination of claim 1 including an appendage mounted on a portion of said medium and consisting of a bulk single crystal intrinsic semiconductor, said electric control means being disposed along said appendage, wherein said appendage is of rectangular cross-section.

16. The combination of claim 1 including an appendage mounted on a portion of said medium and consisting of a bulk single crystal intrinsic semiconductor, said electric control means being disposed along said appendage, wherein said appendage is of triangular cross-section.

* * * * *